United States Patent [19]

Park et al.

[11] Patent Number: 5,500,047
[45] Date of Patent: Mar. 19, 1996

[54] APPARATUS FOR ADSORBING ATOMIC HYDROGEN ON SURFACE

[75] Inventors: Kang-Ho Park; Jeong-Sook Ha; Seong-Ju Park; El-Hang Lee, all of Daejeon, Rep. of Korea

[73] Assignee: Electronics & Telecommunications Research Institute, Daejeon, Rep. of Korea

[21] Appl. No.: 354,037

[22] Filed: Dec. 6, 1994

[30] Foreign Application Priority Data

Nov. 23, 1994 [KR] Rep. of Korea ............. 94-30899

[51] Int. Cl.$^6$ .................................. C23C 16/00
[52] U.S. Cl. ....................................... 118/724
[58] Field of Search .............................. 118/724

[56] References Cited

U.S. PATENT DOCUMENTS

| | | | |
|---|---|---|---|
| 4,237,151 | 12/1980 | Strongin | 118/724 |
| 4,522,674 | 6/1985 | Ninomiya | 118/724 |
| 4,699,085 | 10/1987 | Purdes | 118/725 |
| 4,901,667 | 2/1990 | Suzuki | 118/724 |

FOREIGN PATENT DOCUMENTS

| | | |
|---|---|---|
| 3715644 | 12/1988 | Germany . |
| 58-7817 | 1/1983 | Japan . |
| 62-162324 | 7/1987 | Japan . |
| 3-214724 | 9/1991 | Japan . |

OTHER PUBLICATIONS

SHOP NOTES, Simple Course Of Atomic Hydrogen for Ultrahigh Vacuum Applications, U. Bischer and E. Bertel, pp. 458–460, J. Vac. Sci. Tehcno. A1(2) Mar./Apr. 1993.

Webster's New Collegiate Dictionary, p. 164 G&C Merriam Co., Springfield, Mass. ©1975.

*Primary Examiner*—Richard Bueker
*Attorney, Agent, or Firm*—Antonelli, Terry, Stout & Kraus

[57] ABSTRACT

A surface adsorption apparatus for dissociating $H_2$ molecules into atomic hydrogen in a vacuum vessel and adsorbing the atomic hydrogen on a sample surface is disclosed. A vacuum tube is mounted in the vacuum vessel. A nozzle is connected to the vacuum tube having a plurality of bent portions. A heating member receives electrical power from a power supply source and heats the nozzle to a predetermined temperature. A heat shielding member is located in a path of the atomic hydrogen between one end of the nozzle and the sample surface for shielding the sample surface from heat radiating from the nozzle. The $H_2$ molecules collide with inner wall surfaces of the bent portions to be readily dissociate into the atomic hydrogen. The atomic dissociated hydrogen propagates toward the sample surface and is adsorbed on the sample surface. Since the nozzle comprises bent portions, $H_2$ molecules frequently collide with inner wall surfaces of the nozzle to readily dissociate into atomic hydrogen. The $H_2$ collision efficiency is significantly improved by increased surface collisions with the bent portions. Because the bent portions of the nozzle are heated by the heating member, the construction of the apparatus is simplified.

5 Claims, 1 Drawing Sheet

APPARATUS FOR ADSORBING ATOMIC HYDROGEN ON SURFACE

BACKGROUND OF THE INVENTION

1. Field of the Invention

The present invention relates to an apparatus for adsorbing atomic hydrogen on a surface of a semiconductor, a metal or the like.

2. Description of the Prior Art

Several surface adsorption apparatuses for adsorbing atomic hydrogen on a surface are well known in the art, one of them uses a hot filament to dissociate $H_2$ molecules, and another uses a cylindrical nozzle heated by an electron beam to dissociate $H_2$ molecules. However, in the former there arises the problems that a hot filament is low in dissociation efficiency of $H_2$ molecules and a semiconductor surface is heated by the hot filament, and in the latter there arises the problem that a collision efficiency of $H_2$ molecules with an inner surface of a cylindrical nozzle is relatively low and a structure thereof is complicated.

SUMMARY OF THE INVENTION

It is an object of the present invention to provide an apparatus for adsorbing atomic hydrogen on a surface so as to improve a dissociation efficiency of $H_2$ molecules to atomic hydrogen.

According to the present invention, the surface adsorption apparatus for dissociating $H_2$ molecules into atomic hydrogen in a vacuum vessel and adsorbing the atomic hydrogen on a sample surface, comprising a vacuum tube mounted in the vacuum vessel; a nozzle combined with the vacuum tube, said nozzle having a plurality of bent (non-staight) portions and said nozzle and vacuum tube connected to each other; a heating member for receiving electrical power from a power supply source and for heating the nozzle to a predetermined temperature; and a heat shielding member located on a radiating path of the atomic hydrogen between one end of the nozzle and the sample surface, for shielding the sample surface from heat from the nozzle, wherein the $H_2$ molecules collide with inner wall surfaces of the bent portions and are dissociated into the atomic hydrogen and the dissociated hydrogen dissociated propagates toward the sample surface to be adsorbed on the sample surface.

In this apparatus, the nozzle has a W-shaped structure and is fabricated by winding a tantalum foil using spot-welding.

In this apparatus, the heat shielding member is composed of a tantalum material, and, the nozzle is heated to the temperature of at least 1800° C. by the heating member.

In this apparatus, an inner diameter of the vacuum tube is shorter than that of the nozzle.

Since the surface adsorption apparatus of the present invention comprises the W-shaped nozzle having bent portions, the $H_2$ molecules frequently collide with inner wall surfaces of the nozzle to be easily dissociated into atomic hydrogen. Thus, the $H_2$ collision efficiency is significantly improved upon surface collisions with the bent portions.

Because the bent nozzle of the surface adsorption apparatus is heated by the heat shielding member, the construction of the apparatus is further simplified.

The apparatus also has the heat shielding member for the heat from being radiated toward the sample surface.

BRIEF DESCRIPTION OF THE DRAWINGS

This invention may be better understood and its objects and advantages will become apparent to those skilled in the art by reference to the accompanying drawings as follows.

DESCRIPTION OF THE PREFERRED EMBODIMENT

Figure 1:
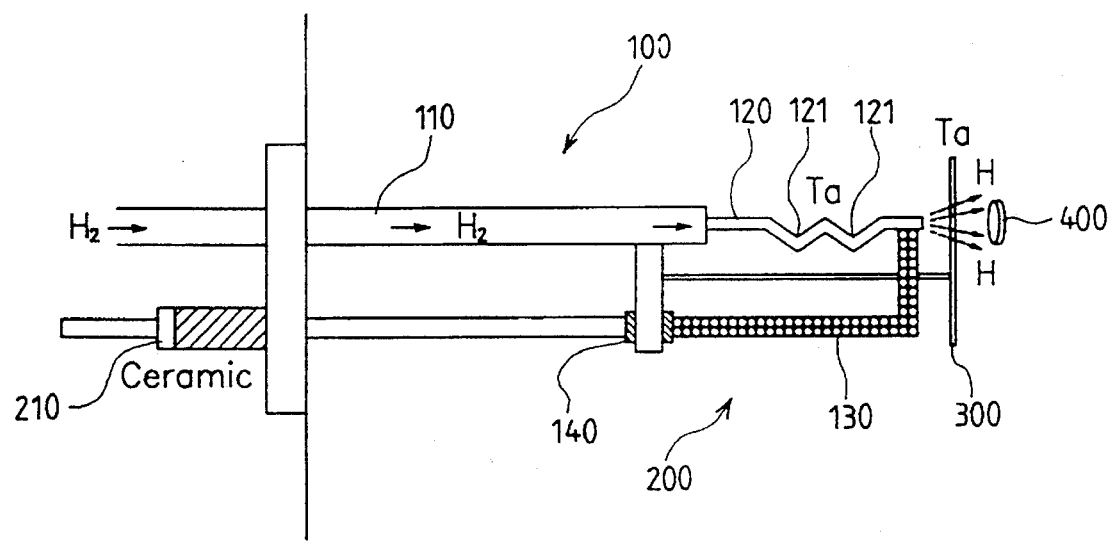
FIG. 1 is a schematic view showing the construction of a main part of the surface adsorbing apparatus according to the embodiment of the present invention.

Referring to FIG. 1, the surface adsorbing apparatus of the present invention comprises a W-shaped nozzle 120 having repeating bending portions 121. The nozzle 120 is heated by a heating member 200 to dissociate $H_2$ molecules therein and radiate atomic hydrogen dissociated thus toward a sample surface 400, such as a semiconductor surface, a Cu surface or the like. The heating member 200 is provided to heat the nozzle 120 to a temperature of 1800° C. and more, and comprises an input terminal connected to an external power supply source(not shown), a copper wire, and a molybdenum line 130 connected between the nozzle 120 and the copper wire. The copper wire is electrically insulated from the vacuum vessel by means of a ceramic insulator 210, 240.

The surface adsorbing apparatus further comprises a vacuum vessel for housing the nozzle 120, the heating member 200, a vacuum tube 110, and the like. The vacuum tube 110 in the vacuum vessel is combined with the nozzle 120, and the vacuum tube 110 and the nozzle 120 are connected to each other. The inner diameter of the vacuum tube 110 is shorter than the nozzle 120.

As shown in FIG. 1, $H_2$ gas is introduced in the vacuum tube 110 by closing and opening valves(not shown). The $H_2$ gas introduced thus is provided to the nozzle 120. Then, in the nozzle 120 which is heated by the heating member 200 the $H_2$ gas dissociates into atomic hydrogen. The dissociated atomic hydrogen is radiated through a heat shielding member 300 toward the sample surface 400.

The heating shielding member 300 is composed of tantalum material, and is provided to prevent heat from the heated nozzle 120 from directly radiating toward the sample surface 400.

Figure 2:
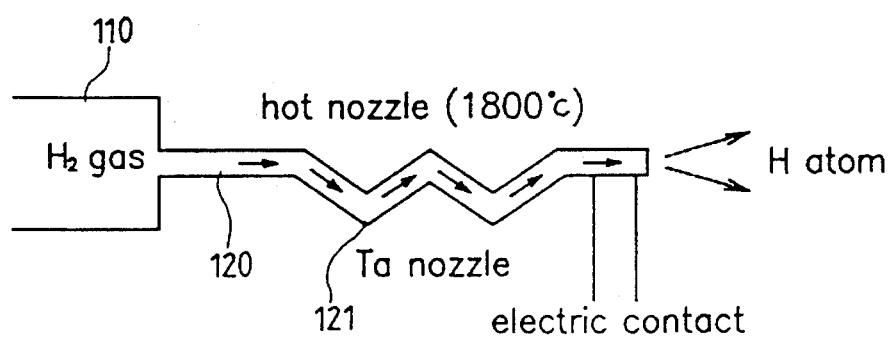
FIG. 2 is a partially enlarged view showing the nozzle of the surface adsorbing apparatus of the present invention.

With reference to FIG. 2, the nozzle 120 has a W-shaped structure which has bent portions 121. In the case when the $H_2$ gas flows into the nozzle 120, $H_2$ molecules collide with the inner wall surfaces of the bent portions 121 to easily dissociate into atomic hydrogen. The inner diameter of the nozzle 120 is 2 mm. A cylindrical nozzle member is fabricated by winding a tantalum foil of about 0.05 mm in thickness and performing well-known sport-welding. By bending the cylindrical nozzle member several times, the nozzle 120 having a plurality of bent portions 121 is fabricated as shown in FIG. 2. In the bent portions 121 of the nozzle 120, the $H_2$ molecules collide with the inner wall surface of the nozzle during flowing of the $H_2$ molecules through the nozzle 120. As a result, $H_2$ collision efficiency is improved.

Hereinafter, operation of the surface adsorption apparatus is described as follows.

First, $H_2$ gas is introduced in the vacuum tube 110 by the closing and opening valves. Since the nozzle 120 is heated to at least 1800° C. by the heating member 200, the $H_2$ molecules are partially dissociated to atomic hydrogen. Their $H_2$ molecules collide several times with the wall surfaces of the bent portions 121 of the nozzle 120 while flowing through the capillary and thus are very readily dissociated into atomic hydrogen. The dissociated atomic hydrogen flows toward the sample surface 400 through the heat shielding member 300 where the atomic hydrogen is adsorbed on the sample surface 400.

As described above, since the surface adsorption apparatus of atomic hydrogen according to the present invention comprises a W-shaped nozzle having bent portions, $H_2$ molecules are caused to frequently collide with inner wall surfaces in the nozzle to be readily dissociate into atomic hydrogen. Thus, the $H_2$ collision efficiency can be significantly improved upon surface collisions with the bent portions.

In addition, because the bent nozzle of the surface adsorption apparatus is heated by the heating member, the construction of the apparatus is further simplified.

Furthermore, the surface adsorption apparatus has a heat shielding member to prevent the heat from the nozzle being radiated toward the sample surface. Therefore, the sample surface is not heated by the heat from the nozzle.

It should be understood that various other modifications will be apparent to and can be readily made by those skilled in the art without departing from the scope and spirit of this invention. Accordingly, it is intended that the scope of the claims appended hereto not be limited to the description as set forth herein, but rather that the claims as encompass all the features of the present invention.

What is claimed is:

1. A surface adsorption apparatus for dissociating $H_2$ molecules into atomic hydrogen in a vacuum vessel and adsorbing the atomic hydrogen on a sample surface, the apparatus comprising:

a vacuum tube mounted in the vacuum vessel;

a nozzle means combined with the vacuum tube, said nozzle means having a plurality of bent portions, each bent portion being formed with internal sections of the tube meeting to form an internal angle between adjacent internal sections inside of the tube, and said nozzle means having a first opening joined to an opening of said vacuum tube;

a heating member connected to said nozzle means, said heating member receiving electrical power from a power supply source and heating the nozzle to a predetermined temperature; and a heat shielding member located in a path of the atomic hydrogen exiting from a second opening of said nozzle means between the second end of the nozzle means and the sample surface for preventing heat from said nozzle means from radiating toward the sample surface; and wherein said nozzle means causes the $H_2$ molecules to collide with inner wall surfaces of the bent portions to dissociate into the atomic hydrogen and the dissociated atomic hydrogen to propagate toward the sample surface and be adsorbed on the sample surface.

2. The surface adsorption apparatus as defined in claim 1 wherein:

said nozzle means comprises a W-shaped structure.

3. The surface adsorption apparatus as defined in claim 1 wherein said nozzle means comprises:

a wound tantalum foil.

4. The surface adsorption apparatus as defined in claim 1 wherein:

said heat shielding member comprises a tantalum material.

5. The surface adsorption apparatus as defined in claim 1 wherein:

an inner diameter of the vacuum tube is less than an internal diameter of the nozzle means.

* * * * *